(12) United States Patent
Shi et al.

(10) Patent No.: US 7,884,469 B2
(45) Date of Patent: *Feb. 8, 2011

(54) SEMICONDUCTOR PACKAGE HAVING A BRIDGED PLATE INTERCONNECTION

(75) Inventors: Lei Shi, Shanghai (CN); Ming Sun, Sunnyvale, CA (US); Kai Liu, Mountain View, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 28 days.

This patent is subject to a terminal disclaimer.

(21) Appl. No.: 12/474,107

(22) Filed: May 28, 2009

(65) Prior Publication Data

US 2009/0236708 A1    Sep. 24, 2009

Related U.S. Application Data

(63) Continuation of application No. 11/906,136, filed on Sep. 28, 2007, now Pat. No. 7,622,796.

(51) Int. Cl.
*H01L 23/34* (2006.01)

(52) U.S. Cl. ............... 257/720; 257/341; 257/E23.013

(58) Field of Classification Search .................. None
See application file for complete search history.

(56) References Cited

U.S. PATENT DOCUMENTS

| | | | |
|---|---|---|---|
| 3,735,017 A | 5/1973 | Manning | |
| 3,737,738 A | 6/1973 | Koenig | |
| 3,842,189 A | 10/1974 | Southgate | |
| 4,083,063 A | 4/1978 | Yu | |
| 4,104,786 A | 8/1978 | Boah et al. | |
| 4,418,470 A | 12/1983 | Naster et al. | |
| 4,996,582 A | 2/1991 | Nagahama | |
| 5,480,841 A | 1/1996 | Bickford et al. | |
| 5,753,942 A | 5/1998 | Seok | |
| 5,821,611 A | 10/1998 | Kubota | |
| 5,864,169 A | 1/1999 | Shimura et al. | |
| 6,040,626 A | 3/2000 | Cheah | |
| 6,136,702 A | 10/2000 | Chandross et al. | |
| 6,249,041 B1 * | 6/2001 | Kasem et al. | ............... 257/666 |

(Continued)

OTHER PUBLICATIONS

Non-final Rejection Mailed Oct. 5, 2004 for U.S. Appl. No. 10/732,181, filed Dec. 9, 2003. cited by other.

(Continued)

*Primary Examiner*—Jarrett J Stark
(74) *Attorney, Agent, or Firm*—Jingming Cai; Schein & Cai LLP (57) ABSTRACT

A semiconductor package is disclosed. The package includes a leadframe having drain, source and gate leads, and a semiconductor die coupled to the leadframe, the semiconductor die having a plurality of metallized source contacts. A bridged source plate interconnection has a bridge portion, valley portions disposed on either side of the bridge portion, plane portions disposed on either side of the valley portions and the bridge portion, and a connection portion depending from one of the plane portions, the bridged source plate interconnection connecting the source lead with the plurality of metallized source contacts. The bridge portion is disposed in a plane above the plane of the valley portions while the plane portions are disposed in a plane intermediate the plane of the bridge portion and the plane of the valley portions.

17 Claims, 8 Drawing Sheets

U.S. PATENT DOCUMENTS

| | | | |
|---|---|---|---|
| 6,287,126 | B1 | 9/2001 | Berger et al. |
| 6,292,140 | B1 | 9/2001 | Osterman |
| 6,294,787 | B1 | 9/2001 | Schieferdecker et al. |
| 6,316,827 | B1 * | 11/2001 | Asano et al. ............... 257/706 |
| 6,479,888 | B1 | 11/2002 | Hirashima |
| 6,548,882 | B1 | 4/2003 | Zwicknagl et al. |
| 6,724,067 | B2 | 4/2004 | Bayraktaroglu |
| 6,849,930 | B2 | 2/2005 | Nakajima et al. |
| 6,881,074 | B1 | 4/2005 | McLenaghan |
| 7,230,322 | B2 | 6/2007 | Funato et al. |
| 7,253,507 | B2 | 8/2007 | Kouzuki et al. |
| 7,622,796 | B2 | 11/2009 | Shi |
| 2001/0045593 | A1 | 11/2001 | De Leeuw et al. |
| 2003/0038341 | A1 | 2/2003 | Bayraktaroglu |
| 2004/0124435 | A1 | 7/2004 | D'Evelyn et al. |
| 2005/0127532 | A1 | 6/2005 | Luo |
| 2005/0194638 | A1 | 9/2005 | Kouzuki et al. |
| 2006/0012055 | A1 | 1/2006 | Foong et al. |
| 2006/0157804 | A1 | 7/2006 | Ueda |
| 2006/0205161 | A1 | 9/2006 | Das et al. |
| 2007/0057368 | A1 | 3/2007 | Ho |
| 2007/0090913 | A1 | 4/2007 | Kim |
| 2007/0114352 | A1 | 5/2007 | Cruz et al. |
| 2007/0235341 | A1 | 10/2007 | Mizohata et al. |
| 2007/0290336 | A1 | 12/2007 | Sun et al. |
| 2008/0054438 | A1 | 3/2008 | Germain et al. |
| 2008/0087992 | A1 | 4/2008 | Shi |

OTHER PUBLICATIONS

U.S. Appl. No. 11/799,467, filed Apr. 30, 2008, entitled Semiconductor Package Having Dimpled Plate Interconnections, and having Ming Sun, Lei Shi and Kai Liu listed as invent.

U.S. Appl. No. 12/321,761, filed Jan. 23, 2009, entitled Semiconductor package having a bridge plate connection, and having Ming Sun, Lei Shi and Kai Liu listed as inventors.

U.S. Appl. No. 11/906,136, filed May 28, 2009, entitled Semiconductor Package Having a Bridged Plate Interconnection, and having Lei Shi, Ming Sun and Kai Liu listed as invent.

International Search Report mailed Dec. 29, 2008 for International Patent Application No. PCT/US08/11202. cited by other.

Written Opinion mailed Dec. 29, 2008 for International Patent Application No. PCT/US08/11202. cited by other.

International Search Report mailed Sep. 25, 2007 for International Patent Application No. PCT/US2006/035641. cited by other.

Written Opinion mailed Sep. 25, 2007 for International Patent Application No. PCT/US2006/03564. cited by other .

International Preliminary Report on Patentability issued Mar. 18, 2008 for International Patent Application No. PCT/US2006/03564. cited by other.

Office Action Mailed Sep. 26, 2008 for U.S. Appl. No. 11/799,467, filed Apr. 30, 2007. cited by other.

Non-final Rejection Mailed Feb. 27, 2007 for U.S. Appl. No. 11/226,913, filed Sep. 13, 2005. cited by other.

Non-final Office Action Jan. 10, 2006 for U.S. Appl. No. 10/732,181.

Office Action Sep. 6, 2006 for U.S. Appl. No. 10/732,181.

Advisory Action Jan. 8, 2007 for U.S. Appl. No. 10/732,181.

Appeal Brief filed on Jul. 16, 2007 for U.S. Appl. No. 10/732,181.

Examiner's Answer dated Oct. 19, 2007 for U.S. Appl. No. 10/732,181.

Board Decision dated Jun. 12, 2009 for U.S. Appl. No. 10/732,181.

Non-final Rejection Mailed Oct. 5, 2004 for U.S. Appl. No. 10/732,181, filed Dec. 9, 2003. cited by other.

Final Rejection Mailed Sep. 18, 2007 for U.S. Appl. No. 11/226,913, filed Sep. 15, 2003.

Final Rejection Mailed Mar. 25, 2008 for U.S. Appl. No. 11/226,913, filed Sep. 15, 2003.

Advisory Action Mailed Aug. 7, 2008 for U.S. Appl. No. 11/226,913, filed Sep. 15, 2003.

Non-Final Rejection Mailed Sep. 11, 2008 for U.S. Appl. No. 11/226,913, filed Sep. 15, 2003.

Final Rejection Mailed Jan. 12, 2009 for U.S. Appl. No. 11/226,913, filed Sep. 15, 2003.

Advisory Action Mailed Jun. 9, 2009 for U.S. Appl. No. 11/226,913, filed Sep. 15, 2003.

Advisory Action Mailed Jul. 2, 2009 for U.S. Appl. No. 11/226,913, filed Sep. 15, 2003.

Final Rejection Mailed May 18, 2005 for U.S. Appl. No. 10/732,181.

Advisory Action dated Sep. 14, 2005 for U.S. Appl. No. 10/732,181.

* cited by examiner

SEMICONDUCTOR PACKAGE HAVING A BRIDGED PLATE INTERCONNECTION

CROSS REFERENCE TO RELATED APPLICATIONS

The present invention is a continuation of U.S. patent application Ser. No. 11/906,136 filed Sep. 28, 2007 now U.S. Pat. No. 7,622,796 entitled SEMICONDUCTOR PACKAGE HAVING A BRIDGED PLATE INTERCONNECTION and having Shi Lei, Sun Ming and Lui Kai listed an inventors, the entire specification of the aforementioned patent application being incorporated by reference herein.

BACKGROUND OF THE INVENTION

The present invention generally relates to a semiconductor package and more particularly to a semiconductor package having a bridged source plate interconnection for connecting a power semiconductor device source metallized contact and a leadframe source lead.

Semiconductor devices are conventionally connected to leadframe leads using either plate interconnections or wire bonding. For example, U.S. Pat. No. 5,821,611 discloses a semiconductor device which comprises a first lead having a tip formed with an island, a semiconductor chip unit mounted on the island of the first lead by means of a solder layer and having a plurality of electrode bumps projecting away from the island, and a plurality of additional leads each of which has a tip electrically connected to the electrode bumps via respective solder deposits. The additional leads include at least second and third leads. The leads are alloyed to the electrode bumps in a heating furnace and the solder bumps may spread during heating and create undesirable shapes.

U.S. Pat. No. 6,040,626 discloses a semiconductor package which employs a mixed connection between a MOSFET top surface comprising a low resistance plate portion for connecting to a source and a wire bond for connecting to a gate. Wire bonding may introduce short or open circuits in the device due to device dielectric layer damage during the wire bonding process.

A semiconductor package with directly connected leads is disclosed in U.S. Pat. No. 6,249,041. A semiconductor device includes a semiconductor chip with contact areas on the top or bottom surface. A first lead assembly, formed from a semi-rigid sheet of conductive material, has a lead assembly contact attached to one of the contact areas of the semiconductor chip. The first lead assembly also has at least one lead connected to and extending from the lead assembly contact. A second lead assembly, also formed from a semi-rigid sheet of conductive material, has a lead assembly contact attached to another one of the contact areas of the semiconductor chip. The second lead assembly also has at least one lead connected to and extending from the lead assembly contact. An encapsulant encloses the semiconductor chip, the lead assembly contact of the first lead assembly and the lead assembly contact of the second lead assembly. The semiconductor device has low electrical and thermal resistance contributions from the package due to the direct connection of the lead assemblies to the chip. The lead assembly contact areas are held in contact with lead contact areas on the semiconductor chip by an electrically conductive adhesive layer. The electrically conductive adhesive layer may be a silver-filled epoxy or polyimide paste or solder bumps. The adhesive layer may be cured in a curing oven, if necessary. The adhesive layer does not include soft solder or solder paste.

Another semiconductor package with directly connected leads is disclosed in U.S. Pat. No. 6,479,888. A MOSFET comprises a plurality of inner leads electrically connected to a surface electrode of a semiconductor pellet having a field effect transistor on a principal surface thereof. The inner leads are mechanically and electrically connected to the principal surface by a gate connecting portion and source connecting portions constituted by bumps.

A common problem encountered in the use of patterned plate or clip interconnections is that the plates or clips may float during solder reflow and result in a misaligned interconnection. In some cases, the misalignment results in a short circuit between the source and gate contact areas resulting in low assembly yields. Furthermore, it is difficult to control the required solder volume to prevent this problem.

Another problem resulting from the use of patterned plate or clip interconnections is the thermal expansion mismatch between the silicon of the semiconductor device and the metal of the patterned plate or clip. The larger the contact area of the patterned plate or clip, the higher the stress induced by the mismatch, which often results in die cracking. To reduce the stress, a smaller plate or clip may be used. However, the smaller contact area may result in higher resistance.

There is therefore a need in the art for a semiconductor package that includes a semiconductor power device connected to source and gate leads by means of patterned plates that overcomes the problems of the prior art. There is also a need for a patterned plate interconnection that does not float during solder reflow and ensures precise clip placement and location assurance. There is also a need for a semiconductor package having device metallized contacts for restricting the flow of solder during the soldering process. There is also a need for metallized contacts formed of Ni/Au. There is also a need for a semiconductor package process that increases throughput and provides easier assembly process control. There is also a need for a semiconductor package method that provides a soft attachment process of the patterned plates onto the semiconductor power device. There is also a need for a semiconductor package having an exposed source plate. There is also a need for a semiconductor package having reduced electrical resistance. There is a further need for a semiconductor package having improved thermal dissipation properties. There is also a need for a semiconductor package having improved mechanical properties. There is also a need for a semiconductor package having a stamped bridged lead frame plate.

SUMMARY OF THE INVENTION

The present invention overcomes the limitations of the prior art by providing a semiconductor device package having a bridged source plate interconnection between a source lead and a power semiconductor source metallized contact. A bridge portion of the bridged source plate may be exposed to allow for improved thermal dissipation. The bridged source plate connection provides for less contact area with the source metallized contact area. The bridged source plate may include dimples positioned to correspond to the source metallized contacts. Molding compound flows around and under the bridge portion to help anchor the bridged source plate in place.

In accordance with another aspect of the invention, a semiconductor package includes a leadframe having drain, source and gate leads. A semiconductor die is coupled to the leadframe and has at least one metallized source contact. A patterned source plate has a bridge portion, valley portions disposed on either side of the bridge portion, plane portions disposed on either side of the valley portions and the bridge portion and a connection portion depending from one of the plane portions. The patterned source plate connects the source lead with the at least one metallized source contact and an encapsulant covers at least a portion of the semiconductor die and the drain, source and gate leads.

In accordance with yet another aspect of the invention, a semiconductor package includes a leadframe having drain, source and gate leads. A semiconductor die is coupled to the leadframe, the semiconductor die having a plurality of Ni/Au or other solder wettable metal metallized source contact areas. A patterned source plate has a bridge portion, valley portions disposed on either side of the bridge portion, plane portions disposed on either side of the valley portions and the bridge portion, and a connection portion depending from one of the plane portions. The patterned source plate connects the source lead with the plurality of metallized source contact areas and an encapsulant covers at least a portion of the semiconductor die and drain, source and gate leads.

There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of design and to the arrangement of components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other methods and systems for carrying out the several purposes of the present invention. It is important, therefore, that the claims be regarded as including such equivalent methods and systems insofar as they do not depart from the spirit and scope of the present invention.

DETAILED DESCRIPTION OF THE INVENTION

The following detailed description is of the best modes of carrying out the invention. The description is not to be taken in a limiting sense, but is made merely for the purpose of illustrating the general principles of the invention, since the scope of the invention is best defined by the appended claims.

The present invention generally provides a semiconductor device package having a bridged source plate interconnection between a leadframe source lead and a power semiconductor device metallized source contact or contacts. The bridged source plate includes a plate connection having a raised or bridge portion. The bridge portion lies above a plane of valley portions in contact with the metallized source contacts. The bridged source plate interconnection provides for a reduced contact area with the metallized source contacts. During encapsulation, bonding material flows under the bridge portion and provides mechanical strength to the bridged source plate interconnection. The metallized source contact is preferably a Ni/Au plated or sputtered surface. The metallized source contact provides for improved bonding of the bridged source plate interconnection and a reduction of overbonding which often introduces short circuit problems due to dielectric layer damage during wire bonding processes. The metallized source contact further eliminates the need for solder bumps and epoxy adhesive layers as soft solder and solder paste may be used to connect the bridged source plate to the metallized source contact.

In a first aspect of the invention and with reference to FIGS. 1-6, a semiconductor package generally designated 100 includes a leadframe 105 having a die pad 107, a source contact portion 110 and a gate contact portion 115. Source contact portion includes source leads 111, the gate contact portion includes a gate lead 117 and the die pad 107 includes drain leads 109. A power semiconductor die 120 may have a metallized drain area (not shown) coupled to the die pad 107 by solder reflow. Connection between the gate contact portion 115 and a gate metallized contact area may be by a gate plate or a bonding wire.

Figure 1:
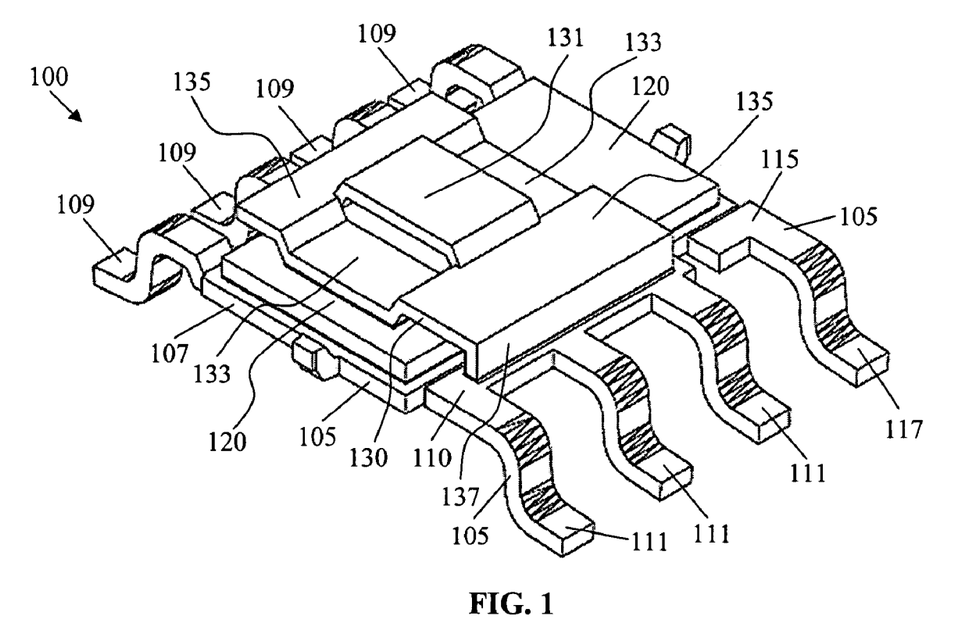
FIG. 1 is a perspective view showing a semiconductor package having a bridged source plate interconnection in accordance with the invention.
Figure 2:
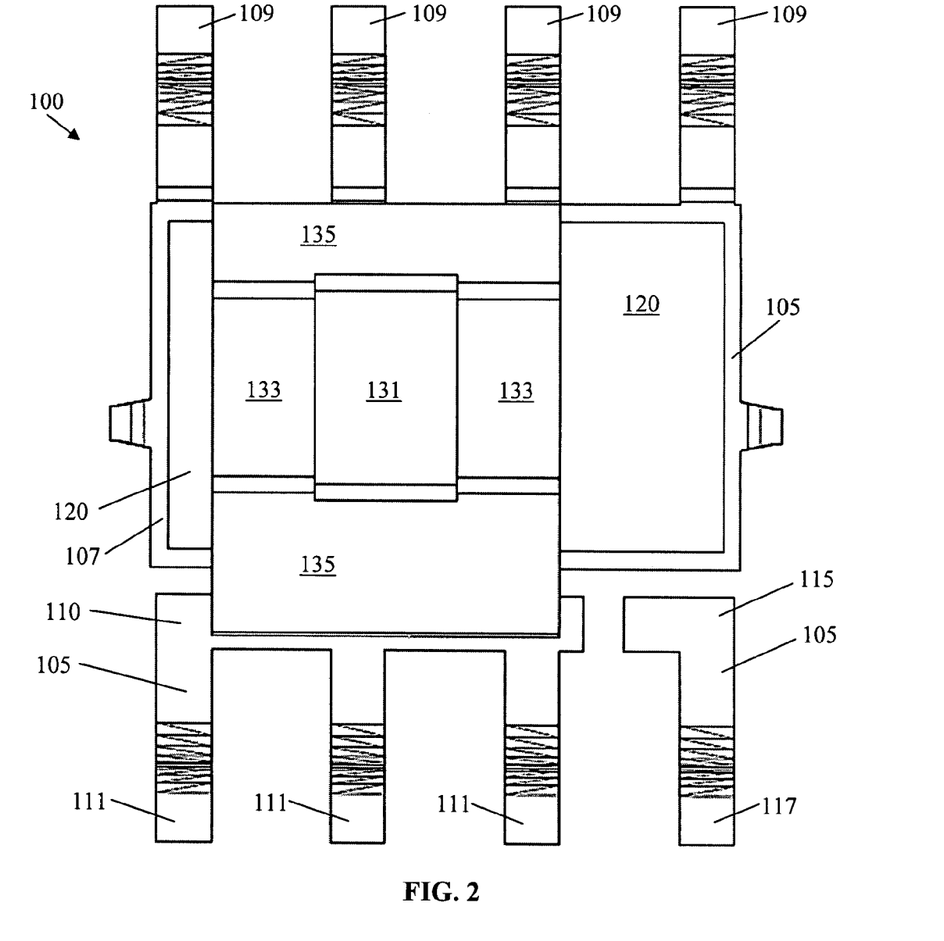
FIG. 2 is a top plan view of the semiconductor package of FIG. 1.
Figure 3:
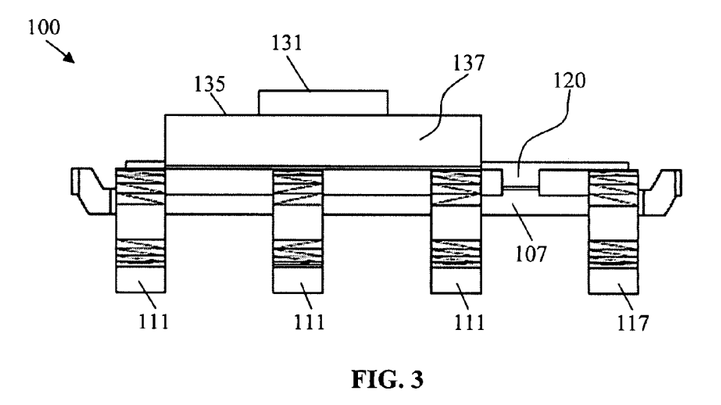
FIG. 3 is a side elevation view of the semiconductor package of FIG. 1.
Figure 4:
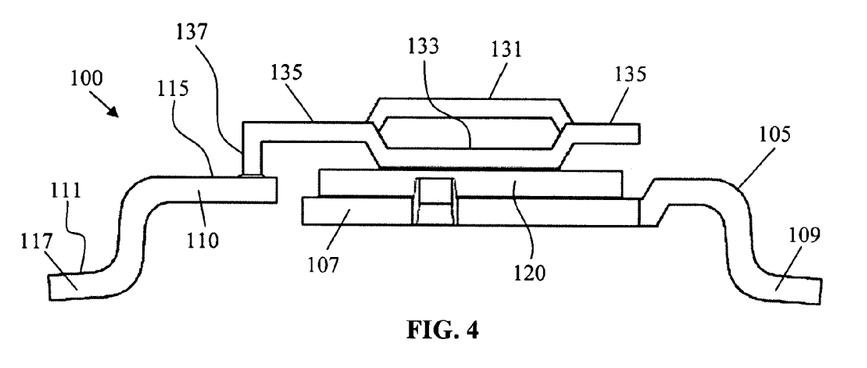
FIG. 4 is a cross sectional view of the semiconductor package of FIG. 1.

In the perspective view of FIG. 1, the source contact portion 110 and the gate contact portion 115 appear to be very close to the die pad 107. However these contact portions are separated from the die pad 107 as can be plainly seen in top plan view of FIG. 2. The same applies to the perspective views of FIG. 7 and FIG. 8.

Semiconductor source and gate metallized contacts may be formed by Ni/Au or Ni/Pd/Au plating or sputtering, or other under bump metallization process.

A bridged source plate 130 includes a metal plate stamped or punched to form a bridge portion 131, valley portions 133 on either side of the bridge portion 131, plane portions 135 on either side of the valley portions 133 and the bridge portion 131, and a connection portion 137 depending from one of the plane portions 135. Bridge portion 131 is disposed in a plane above the plane of the valley portions 133 while the plane portions 135 are disposed in a plane intermediate the plane of the bridge portion 131 and the plane of the valley portions 133. Bridged source plate 130 may be stamped or punched in several steps or in a single step using a die. The connection portion 137 contacts the source contact portion 110 while the valley portions 133 contact the source metallized contact or contacts. Bridged source plate 130 may be coupled to the metallized source contact by solder reflow using soft solder or solder paste. Metallized source contacts may cover a substantial portion of a top surface of the die 120 for improved heat dissipation and decreased resistance and inductance.

Figure 5:
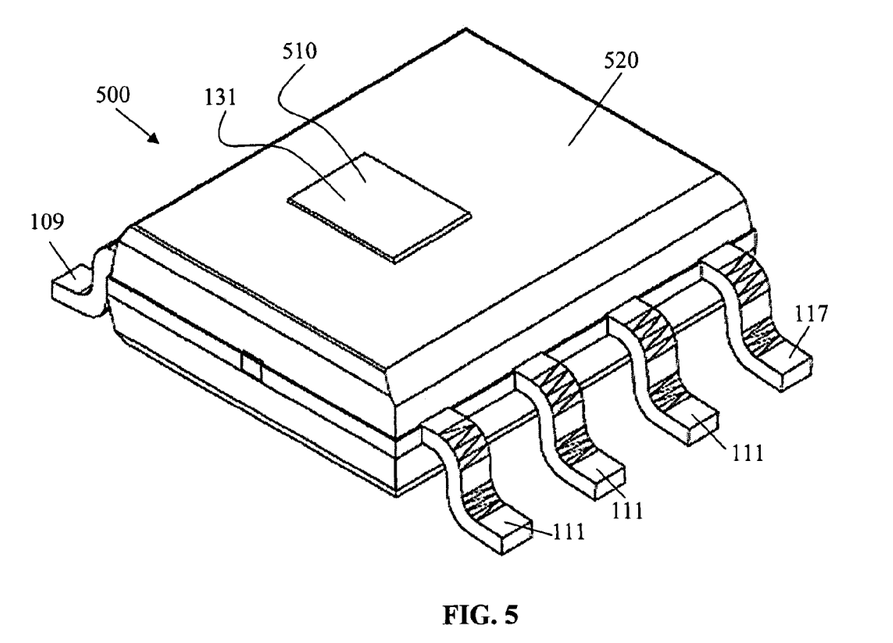
FIG. 5 is a molded semiconductor package having an exposed bridge portion of a bridged source plate in accordance with the invention.

With particular reference to FIG. 5, in a preferred embodiment of the invention a semiconductor package generally designated 500 includes a top surface 510 of the bridged source plate bridge portion 131 exposed through an encapsulant 520. The exposed top surface 510 provides for thermal dissipation of heat generated by the power semiconductor die 120. In addition, the exposed top surface 510 provides an attachment surface for an additional heat sink for additional heat dissipation Flow of encapsulant material under the bridge portion 131 provides for increased mechanical strength of the package 500.

Figure 6:
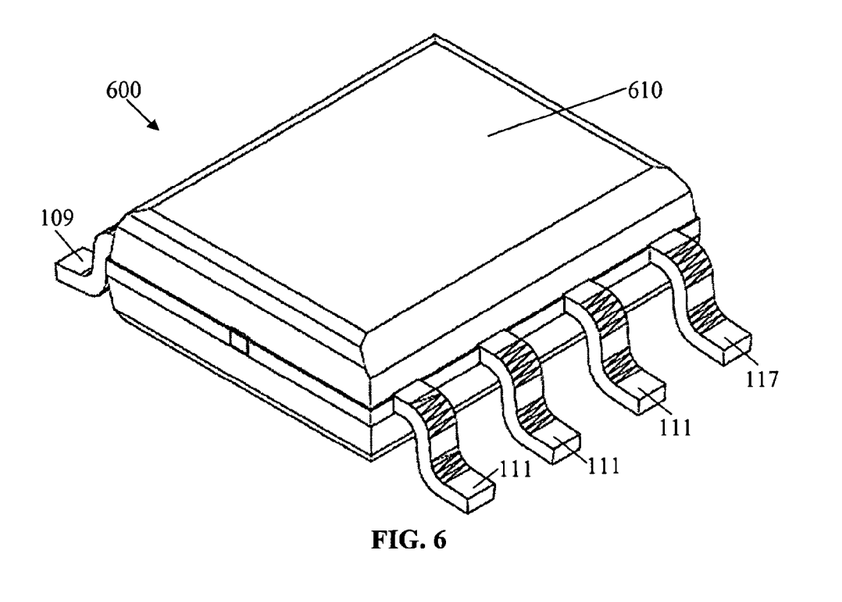
FIG. 6 is a molded semiconductor package having an unexposed bridge portion of the bridged source plate in accordance with the invention.

With reference to FIG. 6, in another embodiment of the invention a semiconductor package generally designated 600 includes an encapsulant 610 covering the power semiconductor die 120 and at least a portion of the drain, source and gate leads. The top surface 510 of the bridge portion 131 is not exposed through the encapsulant 610.

Figure 7:
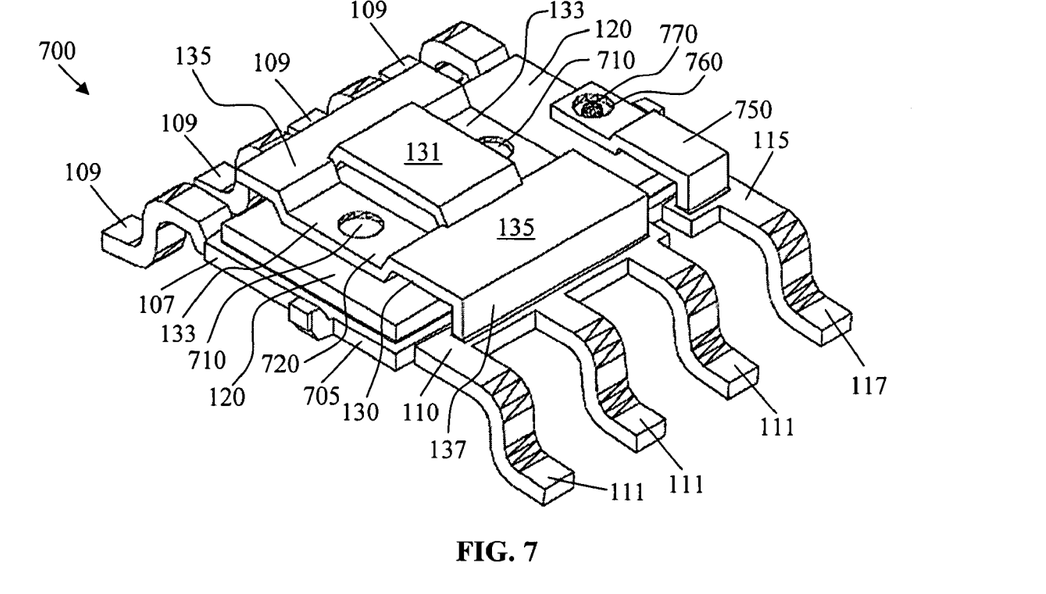
FIG. 7 is an alternative embodiment of the semiconductor package having a bridged source plate in accordance with the invention.
Figure 8:
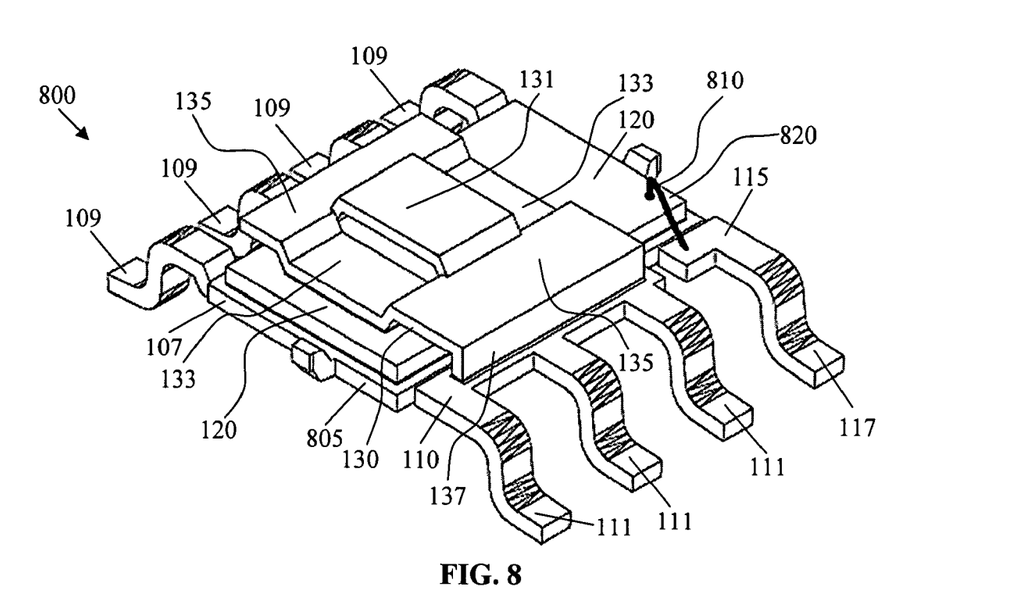
FIG. 8 is yet another alternative embodiment of the semiconductor package having a bridged source plate in accordance with the invention.
Figure 9:
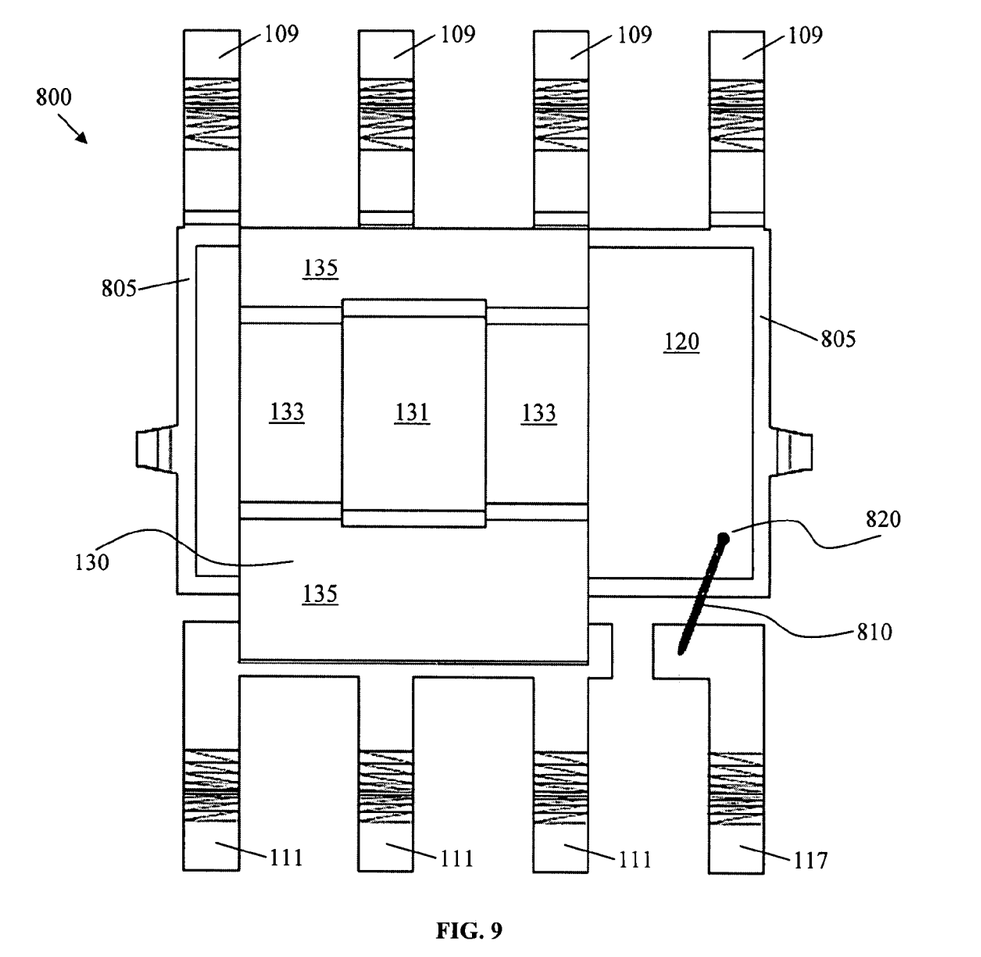
FIG. 9 is a top plan view of the semiconductor package of FIG. 8.
Figure 10:
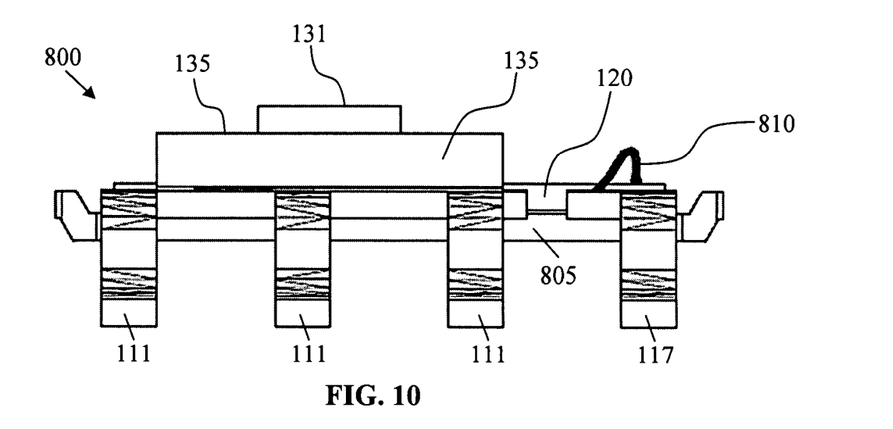
FIG. 10 is a side elevation view of the semiconductor package of FIG. 8.
Figure 11:
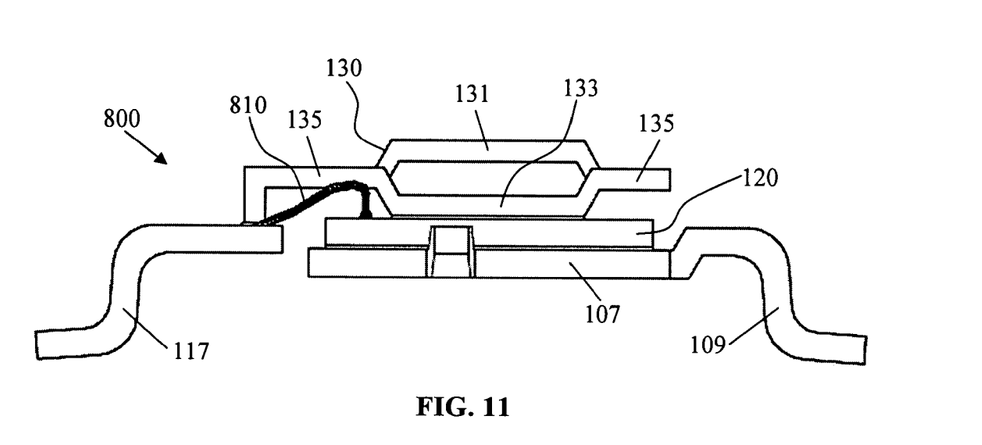
FIG. 11 is a cross sectional view of the semiconductor package of FIG. 8.

In another aspect of the invention, and with reference to FIG. 7, a semiconductor package generally designated 700 includes a leadframe 705 having a die pad 107, a source contact portion 110 and a gate contact portion 115. Source contact portion includes source leads 111, the gate contact portion includes a gate lead 117 and the die pad 107 includes drain leads 109. A power semiconductor die 120 may have a metallized drain area (not shown) coupled to the die pad 107 by solder reflow.

A bridged source plate 130 includes a metal plate stamped or punched to form a bridge portion 131, valley portions 133 on either side of the bridge portion 131, plane portions 135 on either side of the valley portions 133 and the bridge portion 131, and a connection portion 137 depending from one of the plane portions 135. Bridged source plate 130 may be stamped or punched in several steps or in a single step using a die. The connection portion 137 contacts the source contact portion 110 while the valley portions 133 contact the source metallized contact or contacts. Bridged source plate 130 includes a pair of dimples 710 formed in respective valley portions 133. The dimples 710 are concave with respect to a top surface 720 of the valley portions 133 and have bottom surfaces (not shown) extending beyond a plane of a bottom surface thereof. In an alternative embodiment, the dimples 710 have through holes (not shown). Dimpled plate interconnections are disclosed in commonly assigned application Ser. No. 11/799, 467 entitled "Semiconductor Package Having Dimpled Plate Interconnections", the disclosure of which is incorporated herein in its entirety.

It has been found that the bridged source plate 130 is not prone to floating due to the number of distinct source plate dimples 710 contacting the source metallized contact or contacts. Furthermore, the metallized contacts advantageously restrict the flow of soft solder and solder paste to the confines of the metallized contacts during solder reflow, thereby reducing the incidence of undesirable shapes and short circuits.

A gate plate 750 electrically connects the gate contact portion 115 of the gate lead 117 to a gate metallized contact area (not shown) on the power semiconductor die 120. A gate plate dimple 760 is positioned and stamped or punched on the gate plate 750 so as to align with the gate metallized contact of the semiconductor die 120 during solder reflow. The gate plate dimple 760 can optionally include a through hole 770. The through hole 770 allows for the formation of locking balls formed during solder reflow to provide mechanical stability to the gate plate 750. The dimples 710 are optional and in an alternative embodiment of the invention, the semiconductor package has a gate clip 750 but no source dimples 710. The valley portions 133 may be coupled to the metallized source contact of the die 120 by solder reflow using soft solder or solder paste without the use of dimples. In yet another alternative embodiment, the gate plate 750 has no gate plate dimple 760, and the gate plate 750 may be coupled to the metallized source contact of the die 120 by solder reflow using soft solder or solder paste without the use of dimples.

In another aspect of the invention, and with reference to FIGS. 8-11, a semiconductor package generally designated 800 includes a leadframe 805 having a die pad 107, a source contact portion 110 and a gate contact portion 115. Source contact portion includes source leads 111, the gate contact portion includes a gate lead 117 and the die pad 107 includes drain leads 109. A power semiconductor die 120 may have a metallized drain area (not shown) coupled to the die pad 107 by solder reflow.

A bridged source plate 130 includes a metal plate stamped or punched to form a bridge portion 131, valley portions 133 on either side of the bridged portion 131, plane portions 135 on either side of the valley portions 133 and the bridge portion 131, and a connection portion 137 depending from one of the plane portions 135. Bridge portion 131 is disposed in a plane above the plane of the valley portions 133 while the plane portions 135 are disposed in a plane intermediate the plane of the bridge portion 131 and the plane of the valley portions 133. Bridged source plate 130 may be stamped or punched in several steps or in a single step using a die. The connection portion 137 contacts the source contact portion 110 while the valley portions 133 contact the source metallized contact or contacts. Metallized source contacts may cover a substantial portion of a top surface of the die 120 for improved heat dissipation and decreased resistance and inductance. In an alternate embodiment of the invention, source plate dimples (not shown) may be used to connect the valley portions 133 to the metallized source contacts of the die 120.

The gate contact portion 115 is coupled to a gate metallized contact 820 by means of a bonding wire 810.

Figure 12:
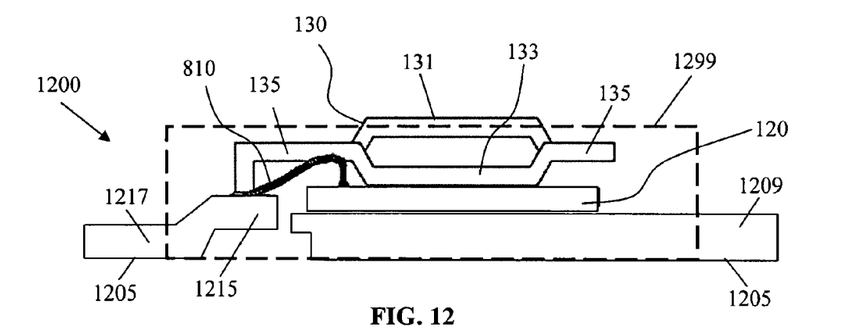
FIG. 12 is a cross sectional view of an alternative embodiment of the semiconductor package in accordance with the invention.
Figure 13:
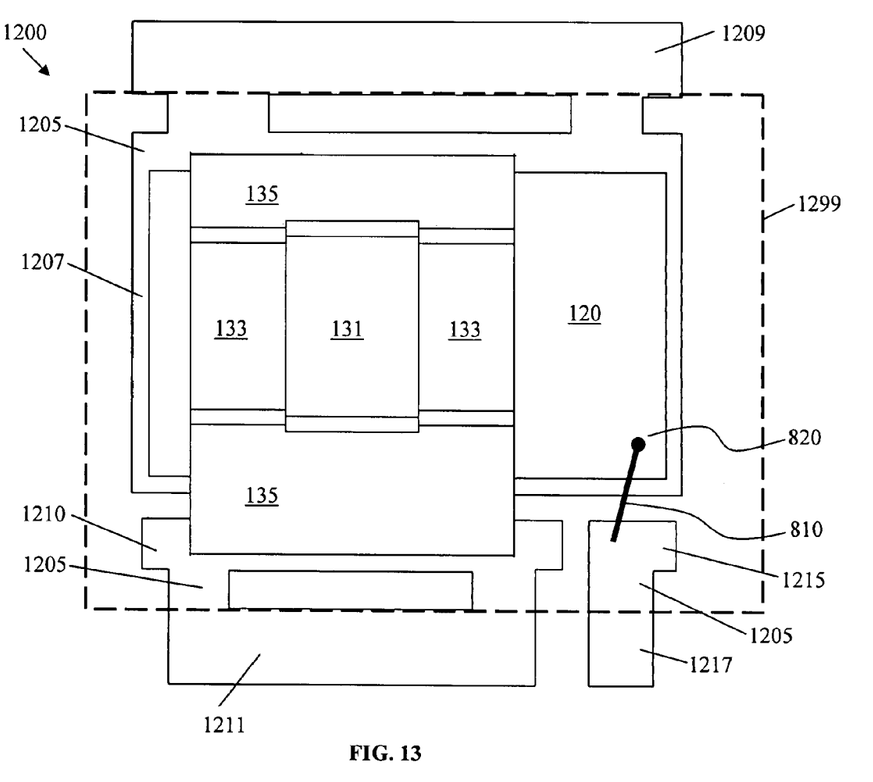
FIG. 13 is a top view of the semiconductor package of FIG. 12.

The bridged source plate 130 can be used in different package types. With reference to FIG. 12 and FIG. 13, a flat-lead package 1200 in accordance with the present invention is shown. A die 120 having a drain contact on a bottom surface and source and gate contacts on a top surface is coupled to a die pad 1207 of leadframe 1205. The leadframe 1205 also includes a source contact portion 1210 and a gate contact portion 1215, though none of these parts are in direct physical or electrical contact with each other. Drain lead 1209 of die pad 1207 establishes electrical connection to drain of the die 120. A bridged source plate 130 connects the source contact of die 120 to source lead 1211 of the source contact portion 110 and a bonding wire 810 connects the gate contact of die 120 to the gate lead 1217 of the gate contact portion 1215. Alternatively, a gate plate (not shown) connects the gate contact of die 120 to the gate lead 1217. Unlike the other embodiments disclosed above where the drain leads 109, source leads 111 and gate lead 117 are bent outside the molding compound 1299, the semiconductor package 1200 provides a lower profile package with flat drain leads 1209, flat source leads 1211 and flat gate lead 1217 extending outside the molding compound 1299 without bending. A portion of the bottom of die pad 1207 may be exposed to provide electrical contact to the drain and to provide better thermal dissipation. Alternatively, the leads may be cut off at the molding compound side surface providing electrical contacts on both bottom and side surfaces of the molding compound encapsulation 1299.

Semiconductor source and gate metallized contacts may be formed by Ni/Au or Ni/Pd/Au plating or sputtering, or other under bump metallization processes. Furthermore, semiconductor die 120 in general is a MOSFET with its source contact and gate contact on the top surface and the drain contact on the bottom surface. however for some specific applications it is desirable to have a MOSFET die with a source contact on the bottom surface and the drain and gate contacts on the top surface. A bottom source MOSFET semiconductor device is disclosed in commonly assigned application Ser. No. 11/495,803 entitled "BOTTOM SOURCE LDMOSFET STRUCTURE AND METHOD", the disclosure of which is incorporated herein in its entirety. When the bridged plate of the present invention is applied to a package having a bottom source MOSFET die according to the embodiments disclosed above, the source and drain contacts are switched, with the bridged plate now connecting the drain of the bottom source die to the drain leads.

The present invention advantageously provides for a bridged plate interconnection having a bridge portion. In preferred embodiments, the bridge portion is exposed to provide for improved thermal performance. In other preferred embodiments, dimples are positioned on valley portions of the bridged plate to correspond to metallized contacts. The dimpled plate ensures that the bridged plate interconnection does not float during solder reflow to thereby ensure precise plate placement and location assurance. The bridged plate is stamped or punched to decrease the cost of the bridge plate.

It should be understood, of course, that the foregoing relates to preferred embodiments of the invention and that modifications may be made without departing from the spirit and scope of the invention as set forth in the following claims.

We claim:

1. A semiconductor package comprising:
 a leadframe having a plurality of leads;
 a semiconductor die coupled to the leadframe, the semiconductor die having metallized contacts;
 a thermally conductive plate placing one of the plurality of leads in electrical communication with one of the metallized contacts, said plate concurrently providing convective and conductive thermal communication with said semiconductor die;
 encapsulant covering a portion of said semiconductor die and a segment of said plurality of leads; and
 wherein a portion of said thermally conductive plate is surrounded by said encapsulant, with a surface of said portion being exposed through said encapsulant.

2. The package as recited in claim 1 wherein said plate includes having a bridge portion, and a valley portion adjacent to said bridge portion, with said bridge portion being in superimposition with, and spaced-apart from, said semiconductor die, defining a volume therebetween.

3. The package as recited in claim 1 wherein said plate includes having a bridge portion, and a valley portion adjacent to said bridge portion, with said valley portion being in mechanical contact with said semiconductor die.

4. The package as recited in claim 1 wherein said plate includes having a bridge portion, and a valley portion adjacent to said bridge portion, with both said bridge portion and said valley portion being in superimposition with said semiconductor dies, said bridge portion being spaced-apart from, said semiconductor die, defining a volume therebetween, with a portion of said volume lying in a plane that is spaced-apart from a plane in which said valley portion lies.

5. The package as recited in claim 1 wherein said plate includes a bridge portion, a pair of valley portions flanking said bridge portion and in mechanical contact with the semiconductor die, said bridge portion being spaced apart from said semiconductor die.

6. The package as recited in claim 1 wherein said plate includes a bridge portion, a pair of valley portions flanking said bridge portion and in mechanical contact with the semiconductor die, said bridge portion being spaced apart from said semiconductor die, said bridge portions and said valley portions defining a channel in superimposition with said semiconductor die.

7. The package of claim 1 further including dimples formed into the valley portions, the dimples being positioned for contact with the at least one metallized source contact.

8. The package as recited in claim 1 wherein, said portion is in superimposition with said semiconductor die.

9. A semiconductor package comprising:
 a leadframe having a plurality of leads;
 a semiconductor die coupled to the leadframe, the semiconductor die having metallized contacts;
 a thermally conductive plate having a bridge portion, and a valley portion adjacent to said bridge portion, with said bridge portion being in superimposition with, and spaced-apart from, said semiconductor die, defining a volume therebetween and said valley portion being in mechanical contact with said semiconductor die;
 encapsulant covering a portion of said semiconductor die and a segment of said plurality of leads; and wherein a portion of said thermally conductive plate is surrounded by said encapsulant, with a surface of said portion being exposed through said encapsulant.

10. The package as recited in claim 9 wherein a portion of said volume lies in a plane that is spaced-apart from a plane in which said valley portion lies.

11. The package as recited in claim 9 wherein said plate further includes an additional valley portion, with said valley portion and said additional valley portion defining a pair of valley portions, said pair of valley portions flanking said bridge portion and in mechanical contact with said semiconductor die.

12. The package as recited in claim 9 wherein said plate further includes an additional valley portion, with said valley portion and said additional valley portion defining a pair of valley portions, said pair of valley portions flanking said bridge portion and in mechanical contact with said semiconductor die, said bridge portions and said pair of valley portions defining a channel in superimposition with said semiconductor die.

13. A semiconductor package comprising:
 a leadframe having a plurality of leads;
 a semiconductor die coupled to the leadframe, the semiconductor die having metallized contacts;
 a thermally conductive plate placing one of the plurality of leads in electrical communication with one of the metallized contacts, said plate concurrently providing convective and conductive thermal communication with said semiconductor die, said plate including a bridge portion, and a pair of valley portions flanking said bridge portion and in mechanical contact with the semiconductor die, said bridge portion being spaced apart from said semiconductor die;

encapsulant covering a portion of said semiconductor die and a segment of said plurality of leads; and wherein a portion of said plate is surrounded by said encapsulant, with a surface of said portion being exposed through said encapsulant.

14. The package as recited in claim 13 wherein said bridge portion is in superimposition with, and spaced-apart from, said semiconductor die, defining a volume therebetween.

15. The package as recited in claim 13 wherein a portion of said volume lying in a plane that is spaced-apart from a plane in which said pair of valley portions lie.

16. The package as recited in claim 13 wherein said plate includes a bridge portion, a pair of valley portions flanking said bridge portion and in mechanical contact with the semiconductor die, said bridge portion being spaced apart from said semiconductor die, said bridge portions and said valley portions defining a channel in superimposition with said semiconductor die.

17. The package as recited in claim 13 wherein said portion is in superimposition with said semiconductor die.

* * * * *